United States Patent
Iwayama et al.

(10) Patent No.: US 8,309,950 B2
(45) Date of Patent: Nov. 13, 2012

(54) SEMICONDUCTOR DEVICE AND MANUFACTURING METHOD THEREOF

(75) Inventors: Masayoshi Iwayama, Kawasaki (JP); Takeshi Kajiyama, Yokohama (JP); Yoshiaki Asao, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 198 days.

(21) Appl. No.: 12/700,536

(22) Filed: Feb. 4, 2010

(65) Prior Publication Data
US 2011/0062417 A1 Mar. 17, 2011

(30) Foreign Application Priority Data
Sep. 16, 2009 (JP) ................................. 2009-214808

(51) Int. Cl.
*H01L 29/78* (2006.01)
*H01L 21/336* (2006.01)

(52) U.S. Cl. ........... 257/24; 257/E21.409; 257/E29.255; 257/401; 257/368; 438/284; 438/286

(58) Field of Classification Search .......... 257/300–326, 257/E21.21, E29.309
See application file for complete search history.

(56) References Cited

U.S. PATENT DOCUMENTS
2006/0216897 A1* 9/2006 Lee et al. ...................... 438/282

FOREIGN PATENT DOCUMENTS
JP 2004-128508 A 4/2004
JP 2007-266390 A 10/2007

OTHER PUBLICATIONS
Li et al., Experimental Investigation on Superior PMOS Performance of Uniaxial Strained <110> Silicon Nanowire Channel by Embedded SiGe Source/Drain, Int. Device Mtg. IEEE 2007, pp. 899-902. Background Art Information.

* cited by examiner

*Primary Examiner* — Mamadou Diallo
(74) *Attorney, Agent, or Firm* — Knobbe, Martens, Olson & Bear LLP

(57) ABSTRACT

First semiconductor layers are in source/drain regions on the semiconductor substrate. A second semiconductor layer comprises first portions on the first semiconductor layers and a second portion on a channel region between the source/drain regions. Third semiconductor layers are on the first portions of the second semiconductor layer. A gate electrode is around the second portion of the second semiconductor layer via an insulating film. Contact plugs are in the first semiconductor layers, the first portions of the second semiconductor layers and the third semiconductor layers in the source/drain regions. A diameter of the contact plug in the second semiconductor layer is smaller than a diameter of the contact plug in the first and third semiconductor layers.

11 Claims, 5 Drawing Sheets

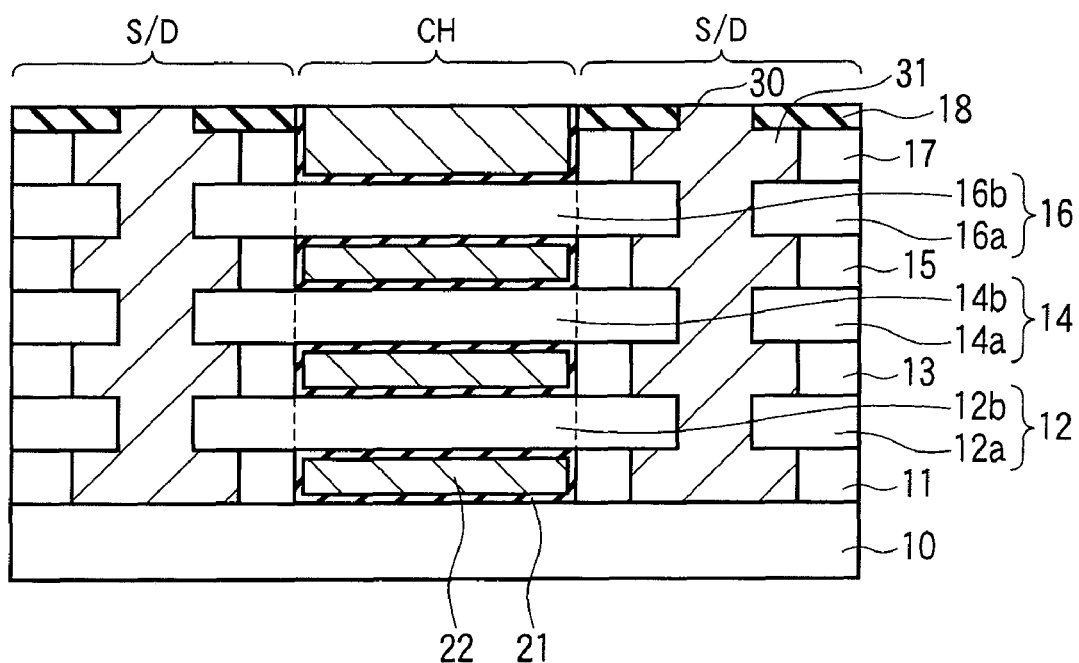
F I G. 2A
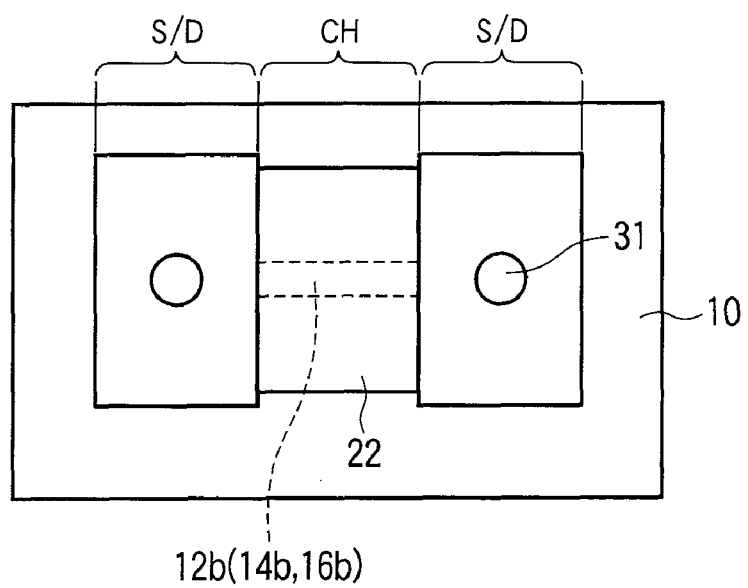
F I G. 2B

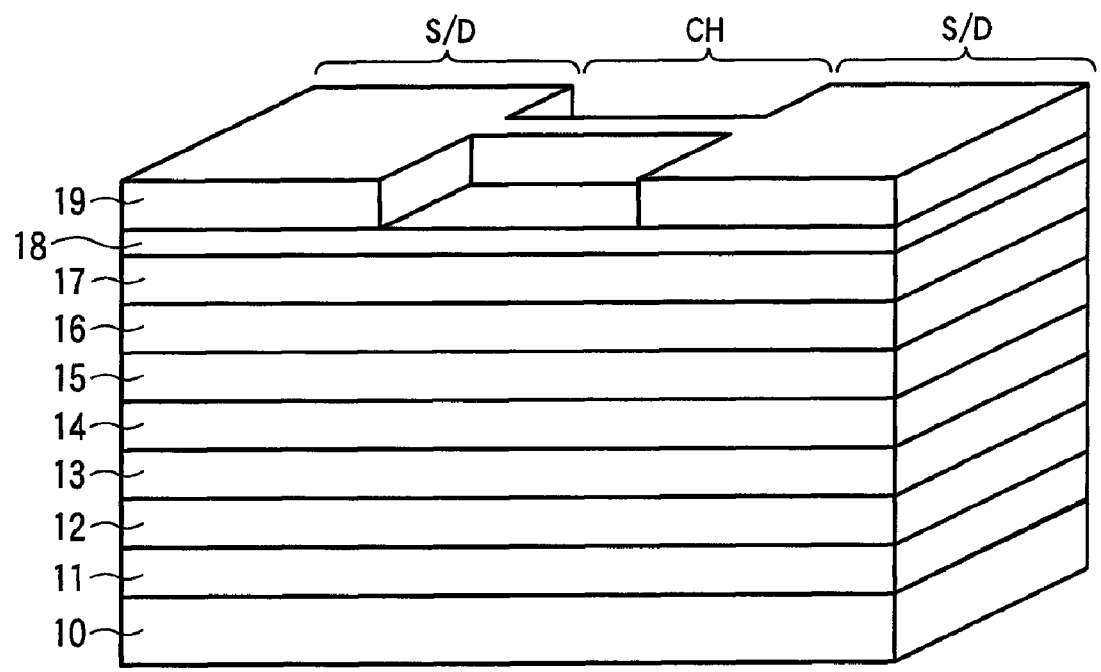
F I G. 3
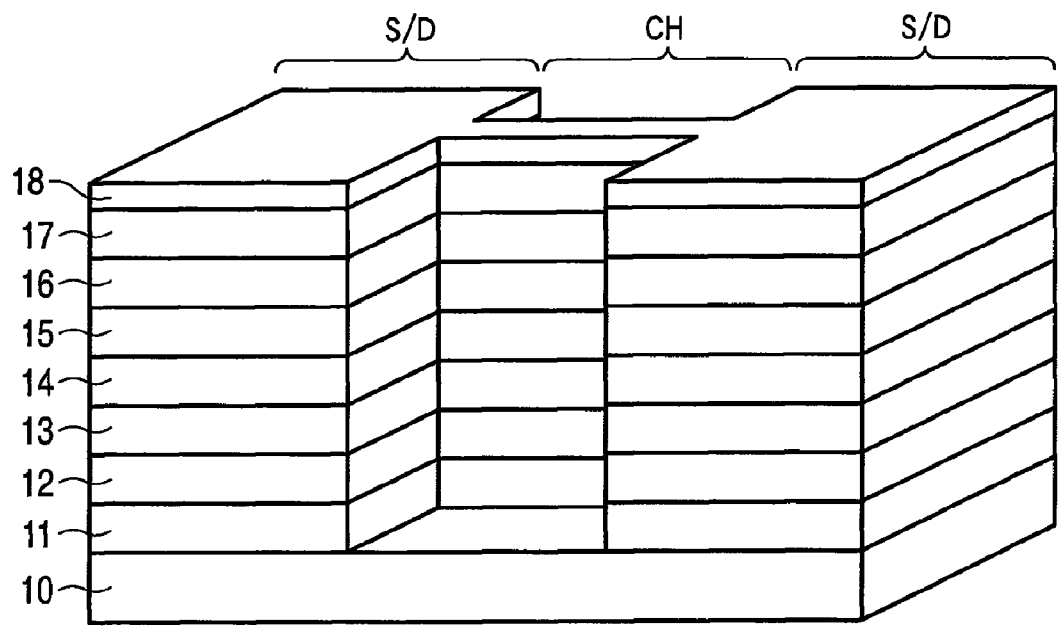
F I G. 4

SEMICONDUCTOR DEVICE AND MANUFACTURING METHOD THEREOF

CROSS-REFERENCE TO RELATED APPLICATIONS

This application is based upon and claims the benefit of priority from prior Japanese Patent Application No. 2009-214808, filed Sep. 16, 2009, the entire contents of which are incorporated herein by reference.

BACKGROUND OF THE INVENTION

1. Field of the Invention

This invention relates to a semiconductor device comprising transistors with gate all around (GAA) structures and a manufacturing method thereof.

2. Description of the Related Art

For example, in a memory cell of a spin-transfer type MRAM, one path is used both for writing and reading. Therefore, it is required to provide a large current in the write operation and a small leak current in the read operation. That is, in the MRAM, it is desired to set a high ON/OFF ratio for the cell transistor. As a cell transistor having a high ON/OFF ratio, a gate all around (GAA) transistor is proposed (for example, see Ming Li, et al., Int. Electron Devices Meet. 2007, 899).

The GAA transistor comprises a thin silicon (Si) nano-wire used as a channel. A gate electrode is formed to surround the Si nano-wire. Since the GAA transistor comprises a fine Si nano-wire as a channel, it is possible to pass a current through the channel without injecting an impurity. Therefore, since electrons that are moving are suppressed from colliding with impurities or the like and scattering within the GAA transistor, ballistic transport is realized.

However, since the parasitic resistance of the GAA transistor is high because of the fine structure, a sufficiently large current cannot be attained. For example, since the Si nano-wire used as a channel is fine, the contact area between the Si nano-wire and a contact plug becomes small. Accordingly, there occurs a problem that the contact resistance between the Si nano-wire and the contact plug becomes high, which reduces the drive current.

BRIEF SUMMARY OF THE INVENTION

According to an aspect of the first invention, there is provided, a semiconductor device comprising: a semiconductor substrate; first semiconductor layers in source/drain regions on the semiconductor substrate; a second semiconductor layer comprising first portions on the first semiconductor layers and a second portion on a channel region positioned between the source/drain regions; third semiconductor layers on the first portions of the second semiconductor layer; a gate electrode around the second portion of the second semiconductor layer via an insulating film; and contact plugs in the first semiconductor layers, the first portions of the second semiconductor layers and the third semiconductor layers in the source/drain regions; wherein a diameter of the contact plug in the second semiconductor layer is smaller than a diameter of the contact plug in the first and third semiconductor layers.

According to an aspect of the first invention, there is provided, a semiconductor device manufacturing method comprising: forming a first semiconductor layer on a semiconductor substrate; forming a second semiconductor layer on the first semiconductor layer; forming a third semiconductor layer on the second semiconductor layer; forming source/drain regions comprising the first, second and third semiconductor layers and forming a channel formation region that positioned between the source/drain regions comprising the first, second and third semiconductor layers by processing the first, second and third semiconductor layers; forming a channel region comprising the second semiconductor layer by removing the first and third semiconductor layers in the channel formation region; forming a gate electrode around the second semiconductor layer in the channel region via an insulating film; forming grooves in the first, second and third semiconductor layers in the source/drain regions, a diameter of the groove in the second semiconductor layer being smaller than a diameter of the groove in the first and third semiconductor layers; and filling contact plugs in the grooves.

BRIEF DESCRIPTION OF THE SEVERAL VIEWS OF THE DRAWING

FIG. 2A is a sectional view along line II-II of FIG. 1, for illustrating the structure of the GAA transistor according to one embodiment of this invention.

FIG. 2B is a plan view showing the structure of the GAA transistor according to one embodiment of this invention.

FIG. 3 to FIG. 5 are perspective views showing the manufacturing steps of the GAA transistor according to one embodiment of this invention.

DETAILED DESCRIPTION OF THE INVENTION

Figure 1:
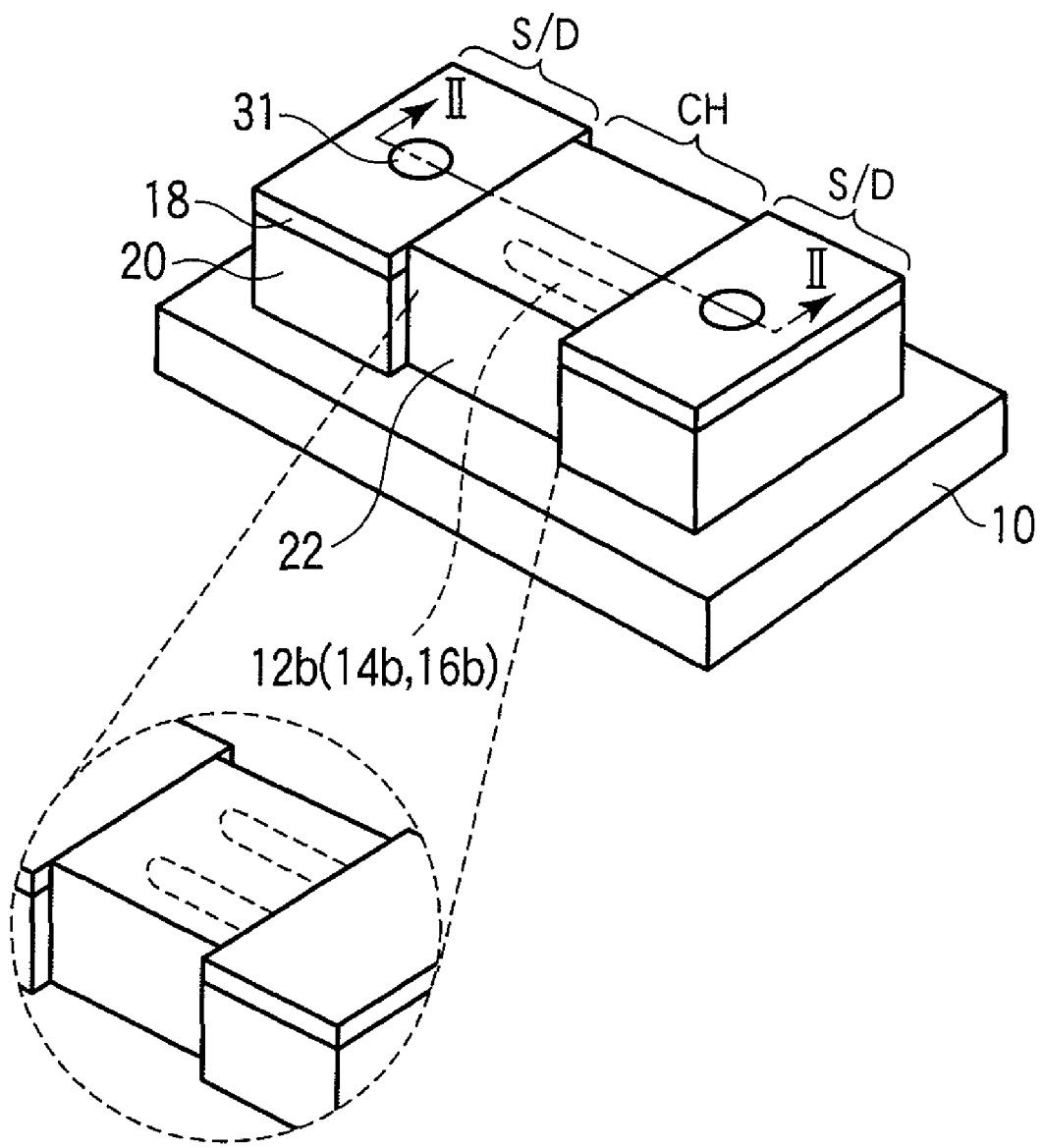
FIG. 1 is a perspective view showing the structure of a GAA transistor according to one embodiment of this invention.

An embodiment of this invention will be explained below with reference to the accompanying drawings. In the drawings, the same reference symbols are attached to common portions.

<Structure>

First, the structure of a GAA transistor according to an embodiment of this invention is explained. FIG. 1 is a perspective view showing the GAA transistor.

As shown in FIG. 1, the GAA transistor includes source/drain regions S/D and a channel region CH.

The source/drain regions S/D are formed with a certain distance therebetween on a semiconductor substrate 10. For example, stacked films 20 each comprising a silicon germanium (SiGe) film (not shown) and a silicon (Si) film (not shown) are formed in the respective source/drain regions S/D. The uppermost and lowermost layers of the stacked film 20 are SiGe films (first and third semiconductor layers), and an Si film (second semiconductor layer) is formed between the SiGe films. The Si film includes an impurity diffusion layer and functions as a source/drain region. Oxide films ($SiO_2$ film) 18 are formed on the respective stacked films 20. Contact plugs 31 are formed in the oxide films 18 and stacked films 20 that correspond to the central portions of the source/drain regions S/D.

The channel region CH is formed between the two source/drain regions S/D on the semiconductor substrate 10. In the channel region CH, a wire-form Si (Si nano-wire) 12b is formed. The Si nano-wire 12b acts as a channel, and therefore, the two source/drain regions S/D are electrically connected to each other. That is, the Si nano-wire 12b is a film formed continuously from the Si film of the source/drain region S/D. A gate electrode 22 is formed around the Si nano-wire 12b via a gate insulating film (not shown).

A case wherein one Si nano-wire 12b is formed for the two source/drain regions S/D is shown, but as indicated by broken lines in FIG. 1, a plurality of Si nano-wires may be formed in a plane (in the same Si film) parallel to the semiconductor substrate 10. Further, not only the Si nano-wire 12b but also a plurality of Si nano-wires 14b, 16b may be formed in a direction perpendicular to the semiconductor substrate 10 by laminating a plurality of stacked films 20 of SiGe films and Si films.

FIG. 2A is a sectional view along the II-II line of FIG. 1. FIG. 2B is a plan view showing the GAA transistor shown in FIG. 1. FIG. 2A and FIG. 2B show an example of the structure obtained by laminating three stacked films 20 each of which is shown in FIG. 1.

As shown in FIG. 2A, the GAA transistor according to this embodiment comprises two source/drain regions S/D and a channel region CH that connects the source/drain regions S/D.

In each of the source/drain regions S/D, SiGe films 11, 13, 15, 17, Si films 12a, 14a, 16a, oxide film 18 and contact plug 31 are formed. The SiGe film 11 is formed on the semiconductor substrate 10. On the SiGe film 11, the Si film 12a is formed. Likewise, the SiGe films 13, 15, 17 and the Si films 14a, 16a are sequentially and alternately formed. Further, on the SiGe film 17, the oxide film 18 is formed. Grooves 30 are formed in the SiGe films 11, 13, 15, 17, Si films 12a, 14a, 16a and oxide film 18. Contact plugs 31 are formed in the grooves 30. The contact plug 31 will be described later.

In the channel region CH, Si films 12b, 14b, 16b, gate insulating films 21 and gate electrodes 22 are formed. The Si films 12b, 14b, 16b are formed at the same levels as the Si films 12a, 14a, 16a, respectively. Further, as shown in FIG. 2B, the Si films 12b, 14b, 16b are formed in a wire form (that are hereinafter referred to as Si nano-wires 12b, 14b, 16b). As will be described later, the Si nano-wire 12b is the same film as the Si film 12a and connects the Si films 12a of the two source/drain regions S/D. That is, the Si films 12a and Si nano-wire 12b are combined to configure the Si film 12. Likewise, the Si nano-wires 14b, 16b are the same films as the Si films 14a, 16a and respectively connect the Si films 14a, 16a of the two source/drain regions S/D. Gate insulating films 21 are formed on the entire peripheral surfaces of the Si nano-wires 12b, 14b, 16b. Gate electrodes 22 are formed on the entire peripheral surfaces of the gate insulating films 21. That is, the entire peripheral surfaces of the Si nano-wires 12b, 14b, 16b are covered with the gate electrodes 22 via the gate insulating films 21.

As described above, the contact plug 31 is filled in the groove 30 formed in the SiGe films 11, 13, 15, 17, Si films 12a, 14a, 16a and oxide film 18 in each source/drain region S/D. The contact plug 31 is formed in a cylindrical form, for example. The diameters of portions of the contact plug 31 which correspond to the Si films 12a, 14a, 16a are larger than the diameters of portions thereof corresponding to the SiGe films 11, 13, 15, 17. That is, the side surfaces of the SiGe films 11, 13, 15, 17 in the groove 30 are recessed with respect to the side surfaces of the Si films 12a, 14a, 16a. Therefore, the contact plug 31 is formed in contact with the side surfaces, upper surfaces and lower surfaces of the Si films 12a, 14a, 16a in the groove 30.

<Manufacturing Method>

Next, a manufacturing method of the GAA transistor according to the embodiment of this invention is explained. FIG. 3 to FIG. 6 are perspective views showing the manufacturing steps of the GAA transistor.

First, as shown in FIG. 3, SiGe films 11, 13, 15, 17 and Si films 12, 14, 16 are sequentially and alternately formed on a semiconductor substrate 10. At this time, the films are formed so that the lowermost layer may act as the SiGe film 11 and the uppermost layer may act as the SiGe film 17. The SiGe films 11, 13, 15, 17 and Si films 12, 14, 16 are formed by an epitaxial growth method, for example. Further, the Si films 12, 14, 16 are formed with a thickness of ten-odd nm, for example. Next, an oxide film 18 is formed on the SiGe film 17. Then, a resist pattern 19 corresponding to Si nano-wires that will be formed later is formed on the oxide film 18 by lithography.

Subsequently, as shown in FIG. 4, the pattern is transferred to the oxide film 18 and the resist pattern 19 is removed. For example, the SiGe films 17, 15, 13, 11 and Si films 16, 14, 11 are simultaneously processed by a reactive ion etching (RIE) process with the oxide film 18 used as a hard mask. At this time, the process is stopped at the surface of the semiconductor substrate 10. Thus, the SiGe films 11, 13, 15, 17 and Si films 12, 14, 16 in the channel region CH are formed in a wire form.

Figure 5:
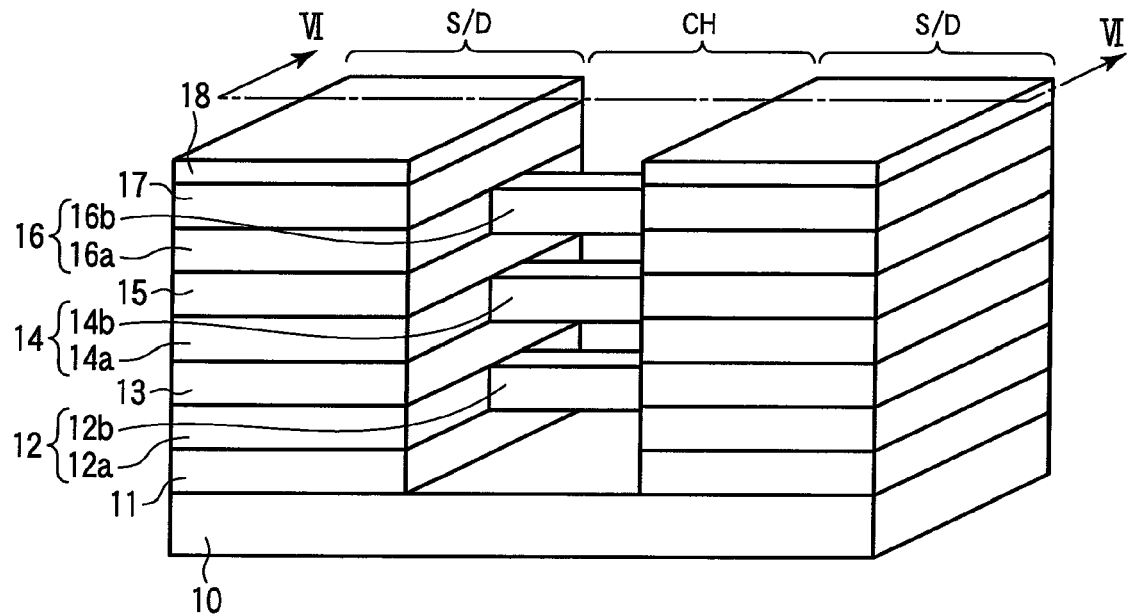

Next, as shown in FIG. 5, a chemical liquid having a high selectivity ratio with respect to the SiGe film is used to remove the SiGe films 17, 15, 13, 11 in the channel region CH. As the chemical liquid, a gas containing chlorine trifluoride (ClF3), for example, is used in the case of dry-etching and hydrofluoric nitric acid, for example, is used in the case of wet-etching. As a result, the entire peripheral surfaces of the Si films 12, 14, 16 in the channel region CH are exposed and Si nano-wires 12b, 14b, 16b are formed.

Subsequently, although not shown in the drawing, the surfaces of the Si nano-wires 12b, 14b, 16b are annealed in an $H_2$ atmosphere of approximately 800° C., for example. Thus, the Si nano-wires 12b, 14b, 16b are formed in a cylindrical form.

Figure 6:
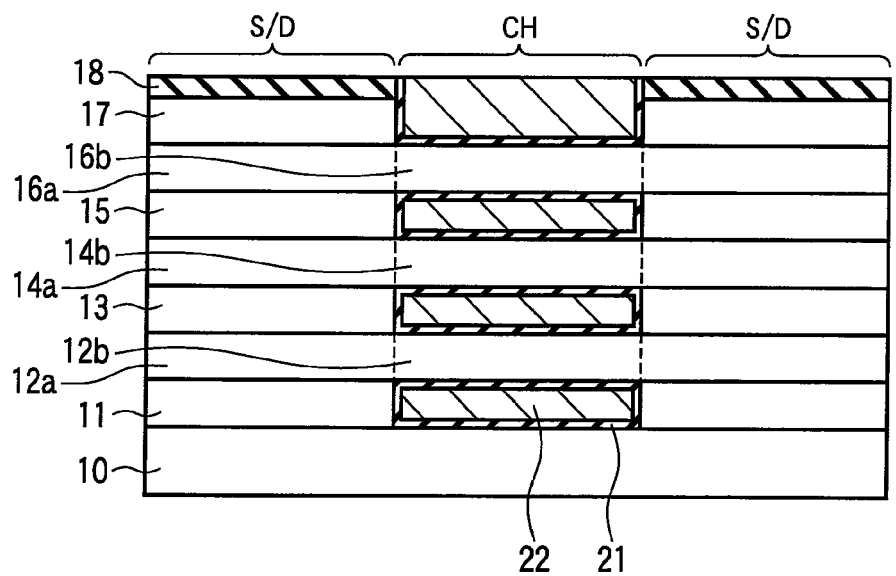
FIG. 6 and FIG. 7 are sectional views along line VI-VI of FIG. 5, for illustrating the manufacturing steps of the GAA transistor according to one embodiment of this invention.
Figure 7:
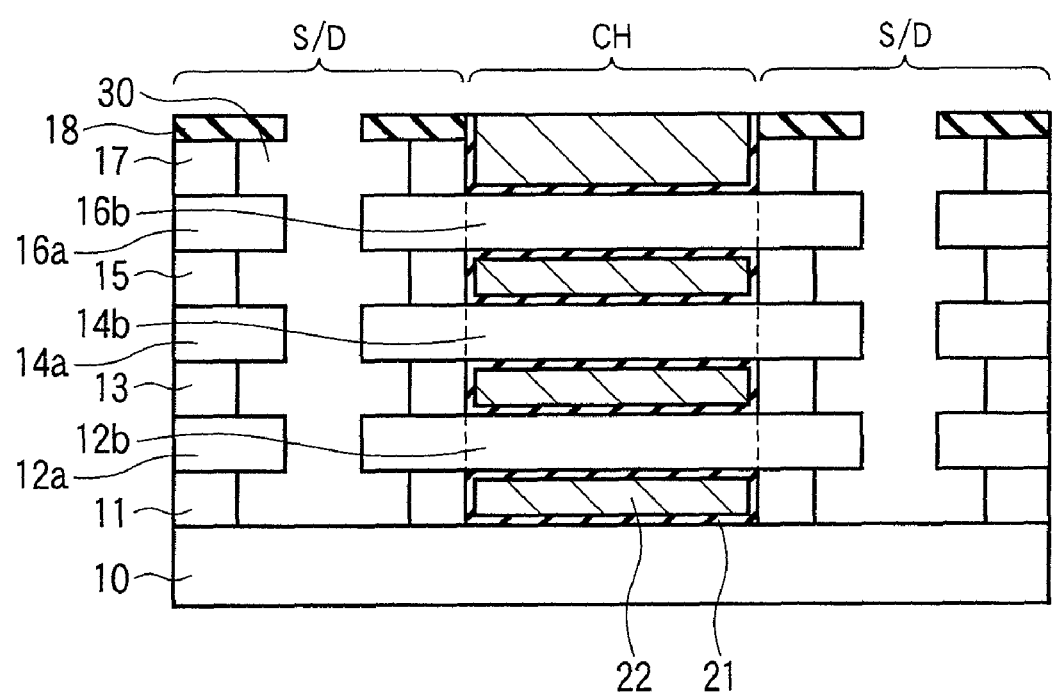

FIG. 6 is a sectional view taken along the line VI-VI of FIG. 5, for illustrating the manufacturing step of the GAA transistor following the step of FIG. 5. FIG. 7 is a sectional view for illustrating the manufacturing step of the GAA transistor following the step of FIG. 6.

As shown in FIG. 6, after formation of the Si nano-wires 12b, 14b, 16b, gate insulating films 21 are formed on the entire peripheral surfaces of the Si nano-wires 12b, 14b, 16b. The gate insulating film 21 is an oxide film, for example. Gate electrodes 22 are formed on the gate insulating films 21 by a chemical vapor deposition (CVD) method, for example. Thus, the gate electrodes 22 are formed on the entire peripheral surfaces of the Si nano-wires 12b, 14b, 16b via the gate insulating films 21.

Next, as shown in FIG. 7, grooves 30 are formed in the oxide film 18, SiGe films 11, 13, 15, 17 and Si films 12a, 14a, 16a in the source/drain regions S/D by the RIE process, for example. The RIE process is performed in a gaseous condition in which the SiGe films 11, 13, 15, 17 can be more easily and selectively etched than the Si films 12a, 14a, 16a. In this case, as a gas seed, for example, $ClF_3$, $CF_4$, $CHF_3$, $Br_2$, $Cl_2$, $C_4F_8$ or $CH_2F_2$ is used. Thus, the side surfaces of the SiGe films 11, 13, 15, 17 in the groove 30 are recessed with respect to the side surfaces of the Si films 12a, 14a, 16a. In other words, the diameters of portions of the groove 30 which correspond to the SiGe films 11, 13, 15, 17 are larger than the diameters of portions of the groove 30 which correspond to the Si films 12a, 14a, 16a. That is, the groove 30 is formed with concave portions in the portions of the SiGe films 11, 13, 15, 17 and convex portions in the portions of the Si films 12a, 14a, 16a. In this case, it is desirable for the lowermost surface of the groove 30 to reach the surface of the semiconductor substrate 10, but it is sufficient to set the same lower than at least the lower surface of the Si film 12a.

Next, as shown in FIG. 2A, contact plugs 31 are filled in the grooves 31. The contact plugs 31 are formed as described below. First, a titanium film is formed on the entire surface by a metal organic chemical vapor deposition (MOCVD) method, for example. Then, the titanium film is subjected to heat treatment. Thus, a salicide film formed by use of the titanium film is formed only on the surfaces of the grooves 30. Next, for example, a tungsten film is formed on the salicide films in the grooves 30. By thus forming the structure, contact plugs 31 formed of the titanium films and tungsten films are formed on the entire surfaces of the convex and concave portions of the side surfaces of the grooves 30 to complete GAA transistors.

<Effect>

According to this embodiment, the diameters of portions of the grooves 30 and contact plugs 31 formed in the source/drain regions S/D which correspond to the Si films 12a, 14a, 16a are smaller than the diameters of portions thereof corresponding to the SiGe films 11, 13, 15, 17. That is, the side surfaces of the SiGe films 11, 13, 15, 17 in the groove 30 are recessed with respect to the side surfaces of the Si films 12a, 14a, 16a. Therefore, the contact plug 31 filled in the groove 30 is in direct contact with not only the side surfaces of the Si films 12a, 14a, 16a but also the upper surfaces and lower surfaces thereof. That is, the contact area between the contact plug 31 and the Si films 12a, 14a, 16a functioning as the source/drain regions becomes larger. Therefore, the contact resistances (parasitic resistances) between the contact plug 31 and the Si films 12a, 14a, 16a can be lowered and a drive current can be made large.

On the other hand, as described before, the stacked film of SiGe/Si that can be easily processed is used in order to form the fine Si nano-wires 12b, 14b, 16b. The lattice constants of SiGe and Si are different from each other. Therefore, strain stress occurs in the interface between the SiGe film and the Si film. This brings about a problem that the mobility of electrons in the Si nano-wire is reduced and the drive current is reduced. The amount of strain stress depends on the size of the contact area between the SiGe film and the Si film. In this embodiment, the size of the contact area between the SiGe film and the Si film can be controlled by recessing the side surfaces of the SiGe films 11, 13, 15, 17 in the groove 30 with respect to the side surfaces of the Si films 12a, 14a, 16a. Therefore, the strain stress occurring in the interface between the SiGe film and the Si film can be controlled and adjusted to an adequate magnitude depending on the device.

This invention has been explained based on this embodiment being applied to the GAA transistor as an example. However, this invention is not limited to this embodiment, and this invention can also be applied to a case wherein contacts are formed in a semiconductor layer in which Si/SiGe films are laminated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate comprising two source/drain regions and a channel region between the source/drain regions;
   one or more first semiconductor layers in the source/drain regions;
   a second semiconductor layer on the first semiconductor layers, the second semiconductor layer comprising first portions in the source/drain regions and a second portion in the channel region positioned between the source/drain regions;
   one or more third semiconductor layers on the first portions of the second semiconductor layer in the source/drain regions;
   a gate electrode around the second portion of the second semiconductor layer via an insulating film; and
   contact plugs in the first semiconductor layers, the first portions of both the second semiconductor layer and the third semiconductor layers in the source/drain regions;
   wherein a diameter of the contact plug in the second semiconductor layer is smaller than a diameter of the contact plug in the first and third semiconductor layers.

2. The device of claim 1, wherein the contact plug is formed in direct contact with upper and lower surfaces of the first portion of the second semiconductor layer.

3. The device of claim 1, wherein the lowermost surface of the contact plug is below the lower surface of the second semiconductor layer.

4. The device of claim 1, wherein the first and third semiconductor layers comprise silicon-germanium (SiGe) films and the second semiconductor layer comprises a silicon (Si) film.

5. The device of claim 1, wherein the contact plug comprises:
   a titanium film formed inside surfaces of the first semiconductor layer, the first portion of the second semiconductor layer and the third semiconductor layer; and
   a tungsten film formed on the titanium film.

6. The device of claim 1, wherein the second semiconductor layer comprises plural second portions that are formed in multiple planes parallel to the semiconductor substrate.

7. The device of claim 1, further comprising:
   a fourth semiconductor layer on the third semiconductor layers, the fourth semiconductor layer comprising third portions in the source/drain regions and a fourth portion in the channel region; and
   fifth semiconductor layers on the third portions of the fourth semiconductor layer in the source/drain regions;
   wherein
   the gate electrode is around the fourth portion of the fourth semiconductor layer via an insulating film;
   the contact plugs are in the third portions of the fourth semiconductor layer and the fifth semiconductor layers; and
   a diameter of the contact plug in the fourth semiconductor layer is smaller than a diameter of the contact plug in the fifth semiconductor layer.

8. A semiconductor device manufacturing method comprising:
   forming a first semiconductor layer on a semiconductor substrate;
   forming a second semiconductor layer on the first semiconductor layer;
   forming a third semiconductor layer on the second semiconductor layer;
   forming source/drain regions comprising the first, second and third semiconductor layers;
   forming a channel formation region between the source/drain regions comprising the first, second and third semiconductor layers by processing the first, second and third semiconductor layers;

forming a channel region comprising the second semiconductor layer by removing the first and third semiconductor layers in the channel formation region;

forming a gate electrode around the second semiconductor layer in the channel region via an insulating film;

forming grooves in the first, second and third semiconductor layers in the source/drain regions, a diameter of the groove in the second semiconductor layer being smaller than a diameter of the groove in the first and third semiconductor layers; and filling contact plugs in the grooves.

9. The method of claim 8, wherein the grooves are formed by a reactive ion etching (RIE) process using gas that has a higher selectivity ratio with respect to the first and third semiconductor layers rather than the second semiconductor layer.

10. The method of claim 9, wherein the gas is one of chlorine trifluoride (ClF3), tetrafluoromethane (CF4), fluoroform (CHF3), bromine (Br2), chlorine (Cl2), octafluorocyclobutane (C4F8) and difluoromethane (CH2F2).

11. The method of claim 8, wherein the contact plugs are filled by an metal organic chemical vapor deposition (MOCVD) method.

* * * * *